(12) United States Patent
Lederman et al.

(10) Patent No.: US 6,801,411 B1
(45) Date of Patent: Oct. 5, 2004

(54) DUAL STRIPE SPIN VALVE SENSOR WITHOUT ANTIFERROMAGNETIC PINNING LAYER

(75) Inventors: Marcos Lederman, San Francisco, CA (US); Matthew R. Gibbons, Livermore, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 09/247,882

(22) Filed: Feb. 10, 1999

(51) Int. Cl.[7] .............................................. G11B 5/139
(52) U.S. Cl. ............................ 360/324.11; 360/324.12
(58) Field of Search ................................. 360/314, 315, 360/324.1, 324.11, 324.12; 324/207.21, 252; 29/603.07, 603.08; 338/32 R (56) References Cited

U.S. PATENT DOCUMENTS

| | | | | |
|---|---|---|---|---|
| 5,635,835 A | * | 6/1997 | Mouchot et al. | 360/314 X |
| 5,796,561 A | * | 8/1998 | Mauri | 360/324.11 |
| 5,856,897 A | * | 1/1999 | Mauri | 360/314 |
| 5,859,753 A | * | 1/1999 | Ohtsuka et al. | 360/113 |
| 6,055,136 A | * | 4/2000 | Gill et al. | 360/314 |
| 6,418,000 B1 | * | 7/2002 | Gibbons et al. | 360/324.11 |

* cited by examiner

Primary Examiner—George J. Letscher
(74) Attorney, Agent, or Firm—Carr & Ferrell LLP (57) ABSTRACT

A dual-stripe current-pinned spin valve magnetoresistive read sensor includes a first soft ferromagnetic (FM) layer separated from a second soft FM layer by a first spacer layer formed of conductive material. The first spacer layer is also configured to receive a first biasing current for generating a first magnetic field of sufficient strength to saturate the first soft FM layer. The read sensor further includes a third soft FM layer and a fourth soft FM layer separated by a second spacer layer formed of conductive material. The second spacer layer is configured to receive a second biasing current for generating a second magnetic field of sufficient strength to saturate the fourth soft FM layer. An insulation layer also is disposed between the second soft FM layer and the third FM layer. The first and second biasing currents thereby pin magnetizations of the first and fourth soft FM layers, while having a combined negligible effect on magnetizations of substantial portions of the second and third soft ferromagnetic layers.

22 Claims, 10 Drawing Sheets

DUAL STRIPE SPIN VALVE SENSOR WITHOUT ANTIFERROMAGNETIC PINNING LAYER

BACKGROUND OF THE INVENTION

This invention relates generally to magnetic disk drives, more particularly to spin valve magnetoresistive (MR) read heads, and most particularly to methods and structures for providing a pinning mechanism for spin valve sensors while minimizing pulse amplitude asymmetry.

Figure 1A:
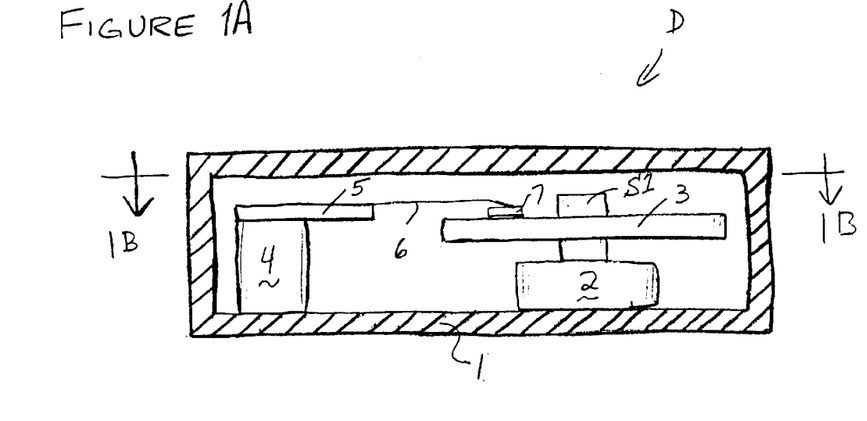
FIG. 1A is a partially sectioned, front elevation view of a magnetic disk drive assembly.
Figure 1B:
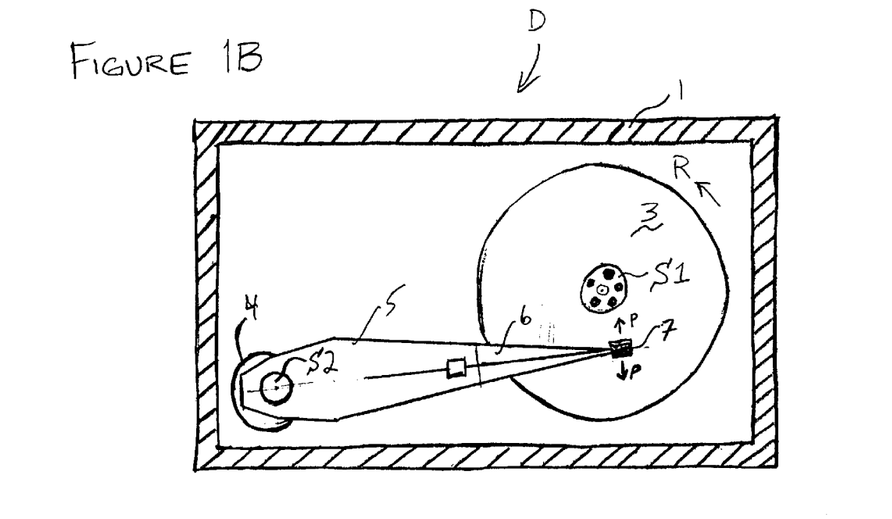
FIG. 1B is a cross section taken along line 1B—1B of FIG. 1A.

Magnetic disk drives are used to store and retrieve data for digital electronic apparatuses such as computers. In FIGS. 1A and 1B, a magnetic disk drive D of the prior art includes a sealed enclosure 1, a disk drive motor 2, a magnetic disk 3, supported for rotation by a spindle S1 of motor 2, an actuator 4 and an arm 5 attached to a spindle S2 of actuator 4. A suspension 6 is coupled at one end to the arm 5, and at its other end to a read/write head, or transducer 7. The transducer 7 is typically an inductive write element with a sensor read element. As the motor 2 rotates the disk 3, as indicated by the arrow R, an air bearing is formed under the transducer 7 to lift it slightly off of the surface of the disk 3. Various magnetic "tracks" of information can be read from the magnetic disk 3 as the actuator 4 is caused to pivot in a short arc, as indicated by the arrows P. The design and manufacture of magnetic disk drives is well known to those skilled in the art.

The most common type of sensor used in the transducer 7 is the magnetoresistive (MR) sensor. An MR sensor is used to detect magnetic field signals by means of a changing resistance in a read element. A conventional MR sensor utilizes the anisotropic magnetoresistive (AMR) effect for such detection, where the read element resistance varies in proportion to the square of the cosine of the angle between the magnetization in the read element and the direction of a sense current flowing through the read element. When there is relative motion between the AMR sensor and a magnetic medium (such as a disk surface), a magnetic field from the medium causes a change in the direction of magnetization in the read element, thereby causing a corresponding change in resistance of the read element. The change in resistance can be detected to recover the recorded data on the magnetic medium.

Another form of magnetoresistive effect is known as the giant magnetoresistive (GMR) effect. A GMR sensor resistance also varies with variation of an external magnetic field, although by a different mechanism than with an AMR sensor. Sensors using the GMR effect are particularly attractive due to their greater sensitivity and higher total range in resistance than that experienced with AMR sensors. One type of GMR sensor is known as a spin valve sensor. In a spin valve sensor, two ferromagnetic (FM) layers are separated by a layer of non-magnetic metal, such as copper. One of the ferromagnetic layers is a "free," or sensing, layer, with the magnetization generally free to rotate when exposed to external fields. In contrast, the other ferromagnetic layer is a "pinned" layer whose magnetization is substantially fixed, or pinned, in a particular direction. In the prior art, this pinning has typically been achieved with an exchanged-coupled antiferromagnetic (AFM) layer located adjacent to the pinned layer.

Figure 2:
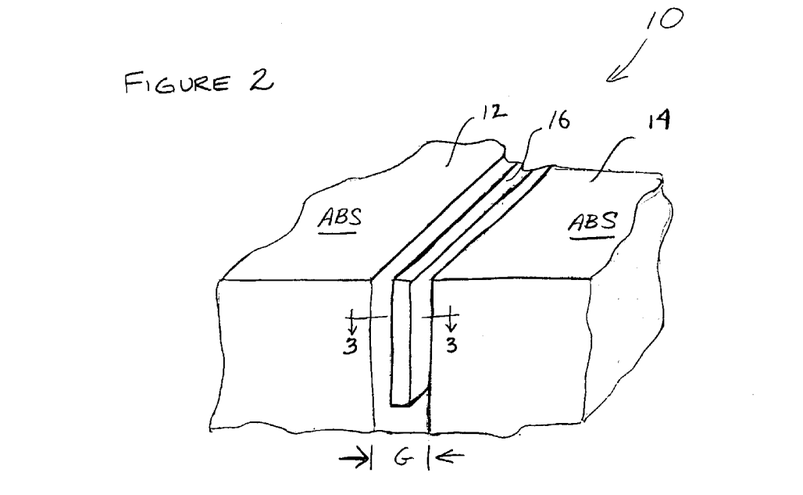
FIG. 2 is a perspective view of a prior art shielded vertical magnetoresistive spin valve sensor head.

More particularly, and with reference to FIG. 2, a shielded, single-element magnetoresistive head (MRH) 10 includes a first shield 12, a second shield 14, and a spin valve sensor 16 disposed within a gap (G) between shields 12 and 14. An air bearing surface ABS is defined by the MRH 10. The spin valve sensor can be centered in the gap G to avoid self-biasing effects. Lines of magnetic flux impinging upon the spin valve sensor create a detectable change in resistance. The design and manufacture of magnetoresistive heads, such as MRH 10, are well known to those skilled in the art.

Figure 3:
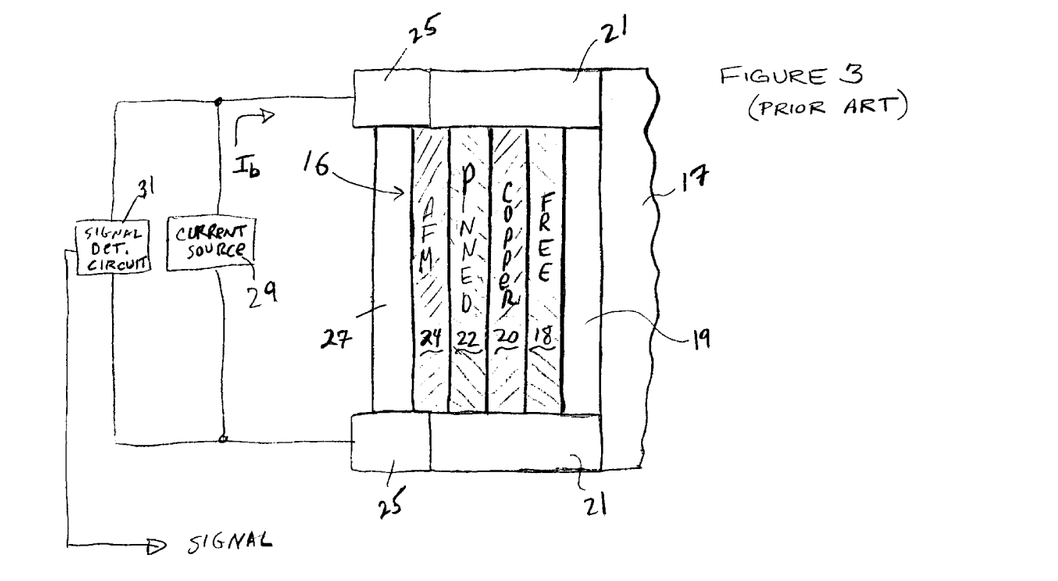
FIG. 3 is a cross-sectional view of the spin valve sensor and associated substrates, support structures, and circuitry taken along line 3—3 of FIG. 2.

In FIG. 3 a cross-sectional view taken along line 3—3 of FIG. 2 (i.e., from the direction of the air bearing surface ABS) illustrates the structure of the spin valve sensor 16 of the prior art. The spin valve sensor 16 includes a free layer 18, a copper layer 20, a pinned layer 22, and an antiferromagnetic (AFM) layer 24. The spin valve sensor 16 is supported by an insulating substrate 17 and a buffer layer 19 which can perform as a seed layer for the formation of the free layer 18 during fabrication. Ferromagnetic end regions 21, which operate as a hard bias, abut the ends of the spin valve sensor 16 and provide stabilization of the free layer 18. Leads 25, typically made from gold or another low resistance material, bring the current to the spin valve sensor 16. A capping layer 27 is provided over the AFM layer 24. A current source 29 provides a current Ib to flow through the various layers of the sensor 16, and signal detection circuitry 31 detects changes in resistance of the sensor 16 as it encounters magnetic fields.

The free and pinned layers are typically made from a soft ferromagnetic material such as permalloy. As is well known to those skilled in the art, permalloy is a magnetic material nominally including 81% nickel (Ni) and 19% iron (Fe). The layer 20 is typically copper. The AFM layer 24 is used to set the magnetic direction of the pinned layer 22, as will be discussed in greater detail below.

Figure 4:
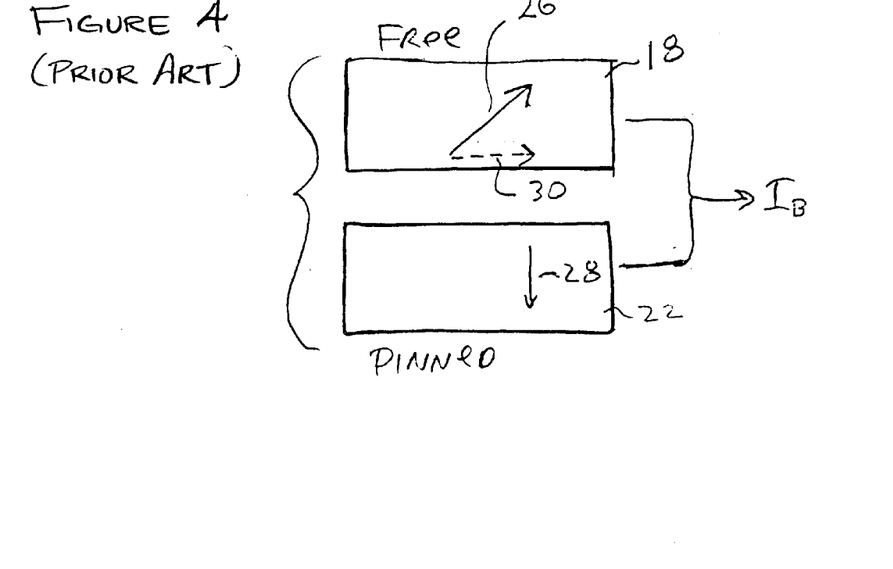
FIG. 4 illustrates the magnetic moment direction of the free and pinned layers of the spin valve sensor of FIG. 3.

The purpose of the pinned layer 22 will be discussed with reference to FIGS. 4 and 5. In FIG. 4, the free layer 18 can have an actual free magnetization direction 26, while the pinned layer 22 has a pinned magnetization 28. Absent the magnetostatic coupling of the pinned layer 22, the ferromagnetic exchange coupling through the copper layer 20, and absent the field generated by the sensing current $I_S$, the free layer 18 may have an initial free magnetization 30. The actual free magnetization direction 26 is the sum of the initial free magnetization 30 and the magnetostatic coupling of the pinned layer 22, the ferromagnetic exchange coupling through the copper layer 20, and the field generated by the sensing current $I_S$. As is known in the art, the magnetization direction of the free layer 18 is preferably variable in response to varying external fields, for example from a nearby magnetic medium.

Figure 5:
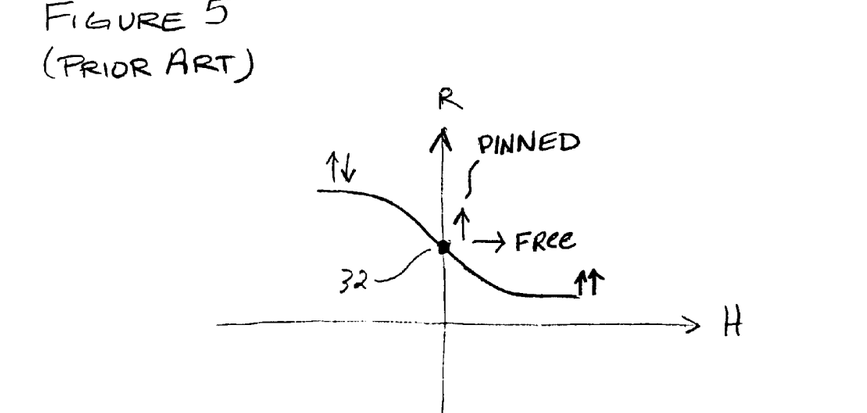
FIG. 5 is a graph illustrating the resistance versus magnetic field relationship of the spin valve sensor of FIG. 3.

As seen in FIG. 5 on the curve of resistance versus magnetic field of the spin valve sensor, the pinned magnetization 28 of the pinned layer 22 at a right angle to the initial free magnetization 30 of the free layer 18 biases the free element to a point 32 on the curve that is relatively linear, and which has a relatively large slope. Linearity is, of course, desirable to provide a linear response, and the relatively large slope is desirable in that it produces large resistance changes in response to the changes in the magnetic field.

The antiferromagnetic material of the AFM layer 24 is typically either a manganese (Mn) alloy such as iron-manganese (FeMn) or an oxide such as nickel-oxide (NiO). The AFM layer 24 prevents the magnetization of the pinned layer 22 from rotating under most operating conditions, with the result that only the magnetic moment of the free layer 18 can rotate in the presence of an external magnetic field.

The spin valve sensor that has the most linear response and the widest dynamic range is one in which the magnetization of the pinned ferromagnetic layer 22 is parallel to the signal field and the magnetization of the free layer 18 is perpendicular to the signal field. However, the use of the AFM layer 24 to pin the pinned layer 22 presents several problems. For one, the exchange field strength generated by the AFM is highly sensitive to temperature. As the temperature increases, the AFM "softens" and its ability to fix the magnetization of the pinned ferromagnetic layer decreases. In consequence, spin valve sensors are highly sensitive to electrostatic discharge (ESD) currents and the resultant heating of the AFM layer 24. Further, AFM materials such as FeMn are much more susceptible to corrosion than the other materials used in the spin valve sensor. The sensitivity of the AFM materials requires careful control of the fabrication process steps and the use of the protective materials for the spin valve sensor. AFM films 24 are also difficult to manufacture, in that they may require high annealing temperatures to obtain the proper crystallographic antiferromagnetic phase.

SUMMARY OF THE INVENTION

The present invention eliminates the need for the antiferromagnetic (AFM) layer in a spin valve sensor, while doubling the read signal and operating in a highly symmetrical differential, or common reject mode, and therefor exhibits high read performance. This is accomplished by providing a pair of spin valve stripes which each include correctly configured free and pinned layers. Further, two separate currents are provided to the spin valve stripes, each of which thereby operates to substantially fix the magnetization of the respective pinned layer, while the combined magnetic effect of the two currents on the free layers is minimized. In addition, the read circuit is configured to combine the difference of the voltage signals from each spin valve stripe.

In an embodiment of the present invention, a dual-stripe current-pinned spin valve magnetoresistive read sensor includes a first soft ferromagnetic (FM) layer having a first Mrt and a second soft FM layer having a second Mrt greater than the first Mrt. A first spacer layer formed of conductive material is disposed between and separating the first and second soft FM layers. The first spacer layer is also configured to receive a first biasing current for generating a first magnetic field of sufficient strength, relative to the first Mrt, to saturate the first soft FM layer. The read sensor further includes a third soft FM layer having a third Mrt and a fourth soft FM layer having a fourth Mrt less than the third Mrt. A second spacer layer formed of conductive material, disposed between and separating the third and fourth soft FM layers, and configured to receive a second biasing current for generating a second magnetic field of sufficient strength, relative to the fourth Mrt, to saturate the fourth soft FM layer. An insulation layer also is disposed between the second soft FM layer and the third FM layer. Further, the first, second, third, and fourth soft FM layers are configured such that when the first and second magnetic fields have sufficient strength to saturate the first and fourth soft FM layers, respectively, the first and second magnetic fields have a combined negligible effect on magnetizations of substantial portions of the second and third soft ferromagnetic layers. By manipulating both of the two spin valve read signals, the overall response of the dual-stripe current-pinned spin valve read sensor is highly symmetrical, exhibits a large read signal, and operates in differential, or common reject mode, and therefor exhibits high read performance. Further, without an AFM layer, the manufacturing complexities and the temperature and ESD sensitivity of the sensor are reduced, while the reliability of the sensor is increased.

In another embodiment of the present invention, a read/write head for accessing and storing data on a medium includes an inductive write element and a dual-stripe current-pinned spin valve magnetoresistive read element. The dual-stripe current-pinned spin valve magnetoresistive read element includes a first soft ferromagnetic layer and a second soft ferromagnetic layer separated by a first spacer layer formed of conductive material. The read element also includes a first lead set formed of conductive material, electrically connected to the first spacer layer and configured to pass a first biasing current through the first spacer layer for pinning the first soft ferromagnetic layer. In addition, a third soft ferromagnetic layer and a fourth soft ferromagnetic layer separated by a second spacer layer formed of conductive material are included. A second lead set formed of conductive material is electrically connected to the second spacer layer and configured to receive a second biasing current for pinning the fourth soft ferromagnetic layer. Additionally, an insulation layer is disposed between the second soft ferromagnetic layer and the third ferromagnetic layer and is formed of electrically insulating material. More specifically, the first, second, third, and fourth soft ferromagnetic layers are configured such that when the first and second biasing currents pin the first and fourth soft ferromagnetic layers, the first and second biasing currents have a combined negligible effect on magnetizations of substantial portions of the second and third soft ferromagnetic layers. In this way, two layers are substantially pinned without the use of an AFM layer, while the magnetizations of two other layers remain substantially free. Exclusion of an AFM layer greatly reduces the manufacturing complexities, reduces the temperature and ESD sensitivity of the sensor, and increases the reliability of the sensor. Also, with the two sets of free and pinned layers, the read performance of the read/write head can be significantly enhanced due to increased signal, high symmetry, and dual-mode operation.

In yet another embodiment of the present invention, a method for forming a dual-stripe current-pinned spin valve read sensor includes forming a first soft ferromagnetic layer, forming a first spacer layer formed of a conductive material above the first ferromagnetic layer, and forming a second soft ferromagnetic layer above the first spacer layer. The method also includes forming an insulator layer of electrically insulating material above the second soft ferromagnetic layer. Above the insulator layer, a third soft ferromagnetic layer is formed, a second spacer layer is formed of a conductive material above the third soft ferromagnetic layer, and a fourth soft ferromagnetic layer is formed above the second spacer layer. Additionally, the method includes forming a first lead set electrically connected to the first spacer layer for passing a first biasing current through the first spacer layer to pin the first soft ferromagnetic layer, and forming a second lead set electrically connected to the second spacer layer for passing a second biasing current through the second spacer to pin the fourth soft ferromagnetic layer. Further, the first, second, third, and fourth soft ferromagnetic layers are formed such that when the first and second biasing currents pin the first and fourth soft ferromagnetic layers, the first and second biasing currents have a combined negligible effect on magnetizations of substantial portions of the second and third soft ferromagnetic layers. Thus, this method provides a read sensor that includes well pinned layers, without the use of an AFM layer which could impose limitations on the fabrication and use of the read sensor. Further, with this method a read sensor is formed that provides a high read signal with high symmetry, and operates in dual-mode to provide high read performance.

These and other advantages of the present invention will become apparent to those skilled in the art upon a reading of the following descriptions of the invention and a study of the several figures of the drawing.

DETAILED DESCRIPTION OF THE PREFERRED EMBODIMENTS

FIGS. 1A, 1B, and 3–5 were discussed with reference to the prior art.

To achieve improved read performance over the prior art, while obviating the need for an antiferromagnetic (AFM) layer, two adjacent current-pinned spin valve elements can be used, separated by an insulation layer. A separate bias current through each of the spin valve elements also affects the magnetization of the other spin valve element to further improve the pinning of the pinned layers. Also, with proper configuration, such a spin valve can operate in differential mode to provide improved performance.

Figure 6:
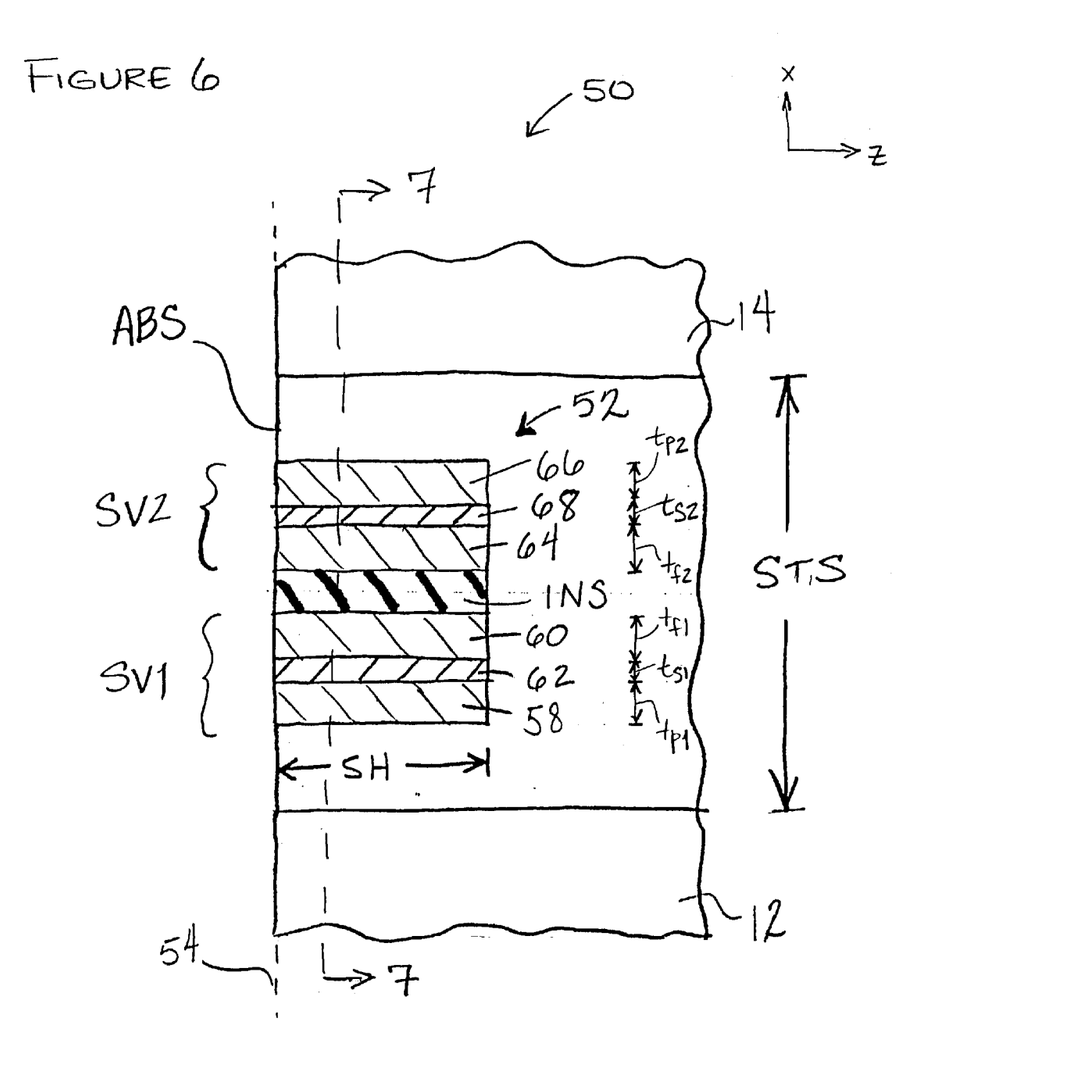
FIG. 6 is a cross-sectional view of a dual-stripe spin valve sensor, according to an embodiment of the present invention.

Such an embodiment of the present invention is shown in FIG. 6 in cross-section. A dual-stripe current-pinned spin-valve read element 50 includes a dual-stripe current-pinned spin-valve read sensor 52 disposed between the first shield 12 and the second shield 14, the three of which define an air bearing surface ABS, in an x-y plane 54, which faces the surface of the magnetic disk (see FIGS. 1A, 1B) during reading operations. The first and second shields 12 and 14 can be separated by a shield-to-shield spacing STS. The shield-to-shield spacing STS is measured in the x-direction or downtrack direction. The dual-stripe current-pinned spin valve read sensor 52 extends from the ABS in the z-direction, or transverse direction, for a distance termed the stripe height SH. Because two spin valves are included, the read sensor 52 of this embodiment can exhibit a read signal about double that of a single spin valve, thereby significantly enhancing read capability.

The dual-stripe current-pinned spin valve read sensor 52 includes a first spin valve stripe SV1 and a second spin valve stripe SV2 which are separated by an insulation layer INS. Each spin valve stripe is formed of two soft ferromagnetic layers separated by a conductive spacer. Thus, the first spin valve stripe SV1 includes a first soft ferromagnetic (FM) layer 58 and a second soft ferromagnetic layer 60, separated from each other by a first spacer 62. Similarly, the second spin valve stripe SV2 includes a third soft ferromagnetic layer 64 and a fourth soft ferromagnetic layer 66 which are separated by a second spacer 68. It should be noted that, unlike the prior art, there is no antiferromagnetic (AFM) layer included in either spin valve stripe. Each of the first, second, third, and fourth FM layers 58, 60, 64, and 66 can be formed of a soft FM material such as permalloy (NiFe), cobalt (Co), cobalt-iron (CoFe), or other soft FM alloy of nickel, iron, and/or cobalt. As is well known to those skilled in the art, a "soft" ferromagnetic material has low coercivity, e.g., less than 15 oersteds. The first and second spacers 62 and 68 can consist essentially of any suitable highly conductive material, such as copper.

It is noted that the thicknesses of the layers can be different from each other and are not shown to scale. The thicknesses $t_{f1}$, $t_{f2}$ of the second and third soft FM layers 60, 64 can be in the range of about 40 angstroms to about 100 angstroms. The thicknesses $t_{s1}$, $t_{s2}$ of the first and second spacers 62, 68 can be in the range of about 20 angstroms to about 55 angstroms. The thicknesses $t_{p1}$, $t_{p2}$ of the first and fourth soft FM layers 58, 66 can be in the range of about 10 angstroms to about 55 angstroms.

Although not shown, a buffer layer also can be included between the second soft FM layer 60 and the first spacer 62, and between the third soft FM layer 64 and the second spacer 68. For example, buffer layers of CoFe can be disposed between a spacer layer consisting essentially of copper, and a soft FM layer consisting essentially of NiFe. Also, the dual-stripe current-pinned spin valve read sensor 52 can additionally incorporate a buffer layer (not shown) which can perform as a seed layer for the formation of the first soft FM layer 58 during fabrication and a capping layer (not shown), similar to those shown in FIG. 3 of the prior art. The buffer layer and capping layer can be formed, for example, of tantalum (Ta) or zirconium (Zr). Methods and apparatuses for creating the various layers 58, 60, 62, 64, 66, 68, and INS are well known to those skilled in the art of spin valve sensors.

The insulation layer INS between the first and second spin valve stripes SV1 and SV2 can be formed of any suitable electrically insulating material such as $Al_2O_3$, SiN, or $Ta_2O_5$. For reasons further discussed below, the thickness of the insulation layer INS is driven by a desire to optimize magnetic coupling between the two spin valve stripes, while maintaining electrical insulation between them. In particular, the minimum thickness is limited by how thin the fabrication processes can make the insulation layer INS without forming pin holes or without breaking down due to different voltages on either side of the insulation layer INS. Further, while the thickness affects the magnetic interaction between the two spin valve elements, the maximum thickness is also limited by the desired shield-to-shield spacing STS, depending upon the desired sensing signal pulsewidth which, in turn, affects the density of the data that can be read from a magnetic medium. For example, the insulation layer INS can have a thickness in the range of about 50 angstroms to about 300 angstroms.

Figure 7:
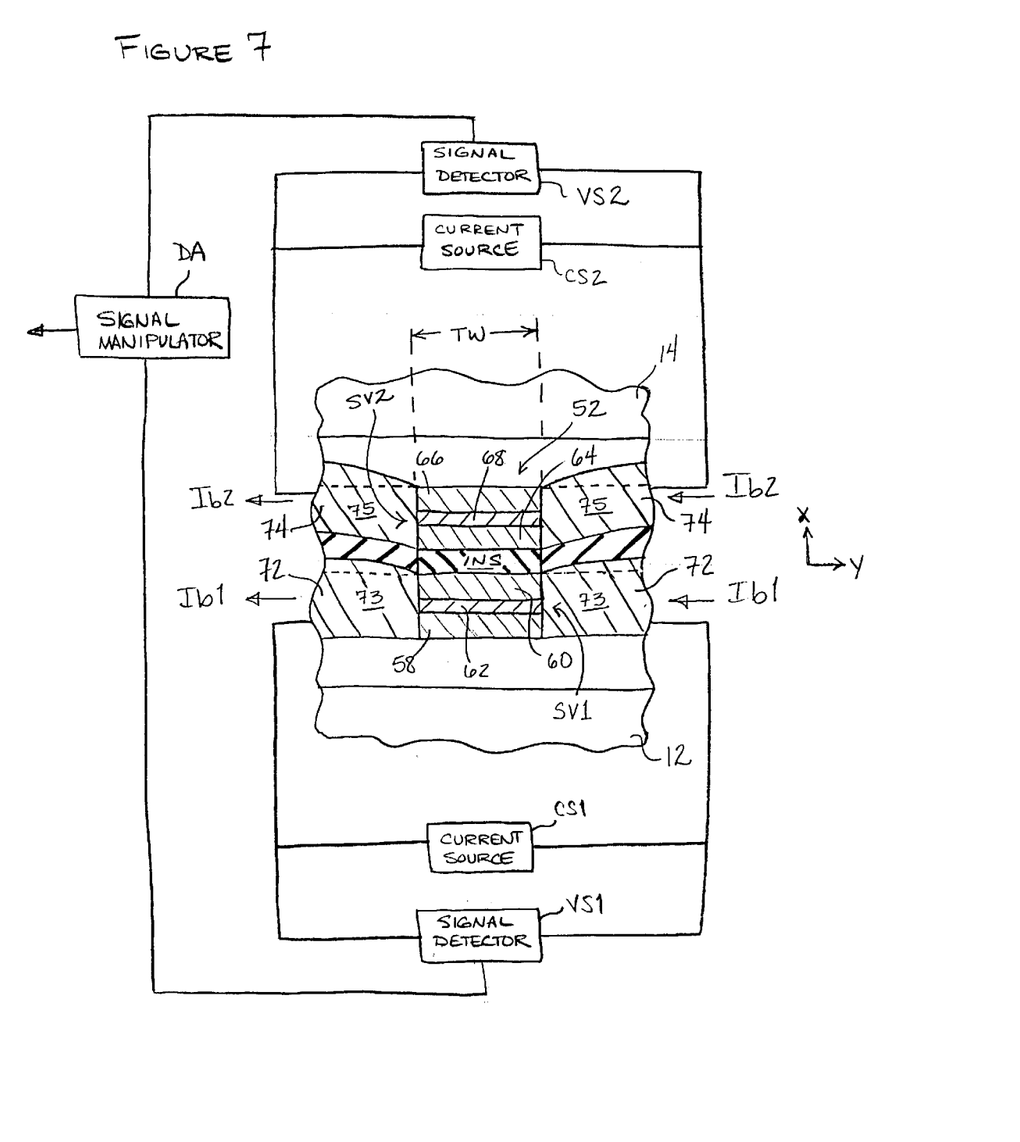
FIG. 7 is a cross-sectional view of the dual-stripe spin valve sensor along the line 7—7 of FIG. 6, according to an embodiment of the present invention.

FIG. 7 shows the dual-stripe current-pinned spin-valve read sensor 52 as viewed along the line 7—7 of FIG. 6 in the x-y plane, in conjunction with a schematic circuit diagram. Here the stripe dimension referred to as trackwidth TW is indicated in the y-direction, or longitudinal direction. A first set of leads, or lead set 72 is shown connected to opposite ends of the first spin valve stripe SV1. Likewise, a second set of leads, or lead set 74 is connected to opposite ends of the second spin valve stripe SV2. These lead sets 72, 74 include hard bias structures 73 and 75 which abut the opposite ends of the first and second spin valve stripes, respectively, to provide transverse biasing to the spin valves. Each set of leads 72, 74 also facilitates the passing of a separate biasing current to each spin-valve stripe. Therefore, the hard bias structures 73 and 75 can be formed of an electrically conductive, magnetic material, while the remainder of each of the lead sets is formed of a highly conductive material, such as gold or copper. Accordingly, the first set of leads 72 can be used to pass a first biasing current Ib1 from a first current source CS1 through the first spin-valve stripe SV1, while a second biasing current Ib2 can be passed from a second current source CS2 through the second spin valve stripe SV2 via the second set of leads 74. The first and second sets of leads also connect signal detectors, such as first and second voltage sensors VS1, VS2, respectively, to the first and second spin valve stripes SV1, SV2 to detect a voltage change across the each spin valve stripe SV1, SV2. Further, the outputs of the first and second voltage sensors VS1, VS2 are combined by a signal manipulator, such as a differential amplifier DA that is connected to the first and second voltage sensors VS1, VS2. The output of the differential amplifier DA is a measure of the difference between the two spin valve signals, which is described below in further detail with respect to FIG. 12.

Figure 8:
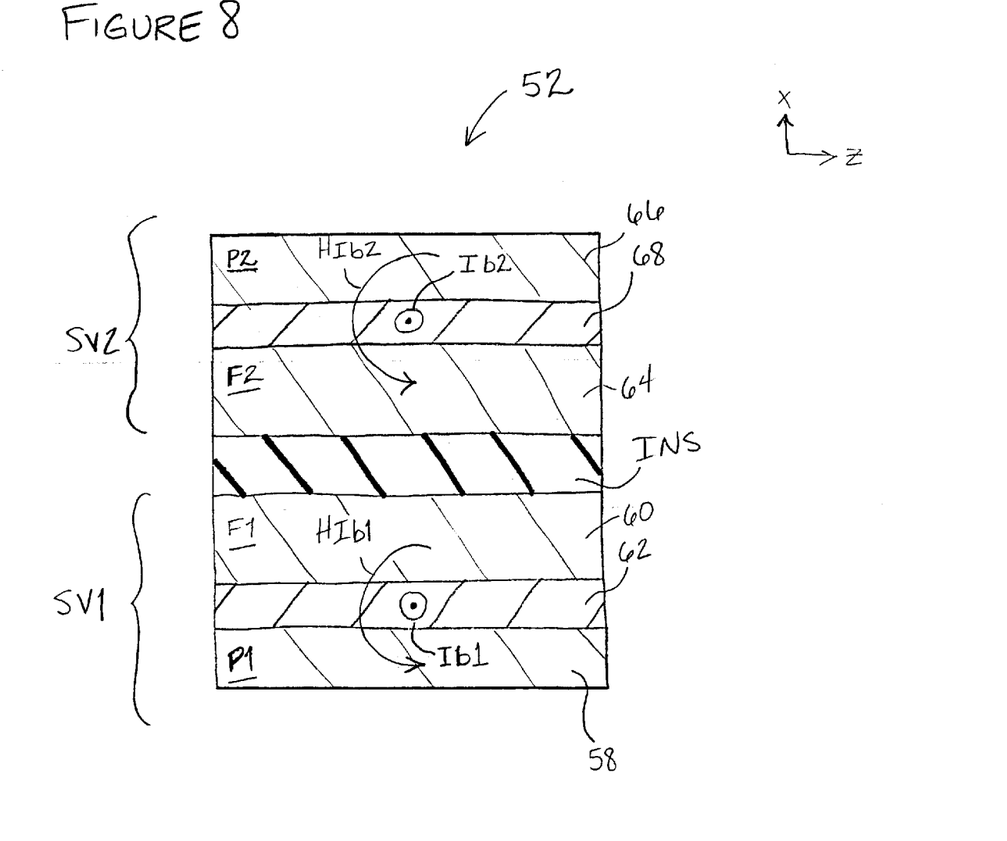
FIG. 8 is an enlarged view of the dual-stripe spin valve sensor cross-section of FIG. 6, according to an embodiment of the present invention.

The first and second biasing currents Ib1 and Ib2 each can be used to pin a layer of each spin valve stripe, as can be better understood with reference to FIG. 8. FIG. 8 is an enlarged cross-sectional view of the dual-stripe current-pinned spin valve read sensor 52 in the x-z plane. It should be understood that the dimensions shown are not to scale and have been chosen for explanatory purposes only. From this view, magnetic fields due to the biasing currents, here shown flowing out of the viewing plane, can be more easily understood. Because the first and second biasing currents Ib1 and Ib2 are in substantially the same direction, the first and second biasing magnetic fields HIb1 and HIb2 have substantially the same orientation, here counterclockwise. With an appropriate level of the first biasing current Ib1, the resulting first biasing magnetic field HIb1 can saturate the first soft FM layer 58, thereby pinning its magnetization to form a first pinned layer P1. Likewise, an appropriate second biasing current Ib2 can create a second biasing magnetic field HIb2 that is sufficiently strong enough to saturate the fourth soft FM layer 66, to pin its magnetization and form a second pinned layer P2. For the presently described embodiments, the first and second biasing currents Ib1 and Ib2 are in substantially the same direction and have substantially the same amplitude. Because no AFM layer is included to provide pinning of the first and second pinned layers P1 and P2, the first and fourth soft ferromagnetic layers are substantially unpinned without the first and second biasing currents.

However, the first and second biasing magnetic fields HIb1 and HIb2 affect the second and third soft FM layers 60, 64 in a different way. In particular, because the two magnetic fields are oriented substantially the same, the effects of the two fields upon each of the second and third soft FM layers tend to substantially cancel each other out throughout a majority of each of those two layers. For example, the first biasing magnetic field HIb1 acts from right to left throughout the second soft FM layer 60, while the second biasing magnetic field HIb2 is from left to right throughout the second soft FM layer. With appropriate layer dimensions and biasing current levels, the effects in opposite directions substantially cancel each other out. A similar effect results in the third soft FM layer 64. Because the magnetizations of the second and third soft ferromagnetic layers are substantially not affected by the biasing currents, the magnetizations and therefore resistances of those layers are free to be affected by an external magnetic field, such as from a magnetic medium. Thus, these layers act as first and second free layers F1 and F2 in the first and second spin valve stripes, respectively.

For the bias currents to pin the first and fourth soft AFM layers, the Mrt product of the first and fourth soft AFM layers 58, 66 are less than the Mrt products of the second and third soft AFM layers 60, 64, respectively. Also, each of the soft AFM layers can have an Mrt of about 0.3 to about 0.5 memu/cm$^2$. Further, the Mrt ratio of the free layer to the pinned layer can be in the range of about 1.1 to about 10. To pin the first and fourth soft AFM layers 58, 66, the bias currents also must be high enough relative to the Mrt of the respective layer to be pinned. For example, with Mrt's such as described above, the first and fourth soft AFM layers 58, 66 of the presently described embodiments can be saturated with biasing currents as small as 4 mA.

Figure 9A:
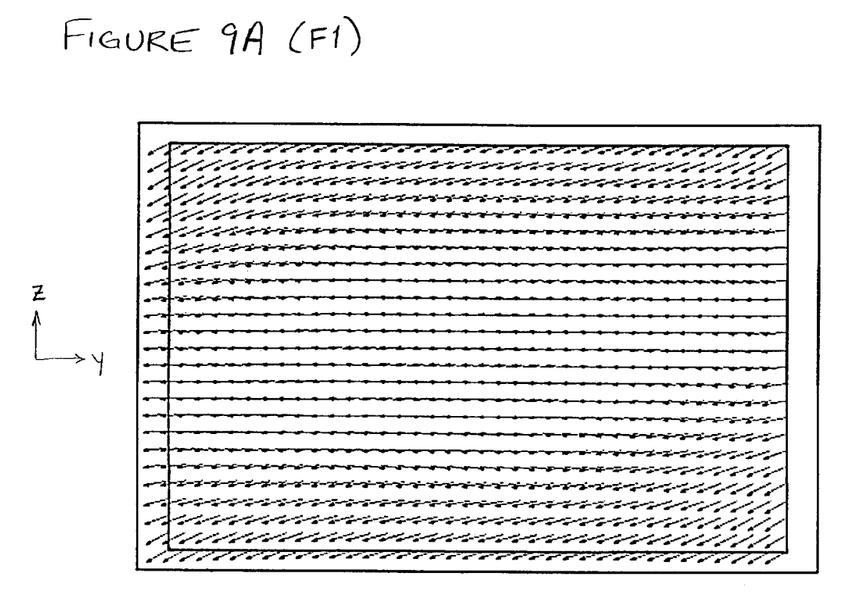
FIG. 9A depicts the magnetizations across a free layer of the dual-stripe spin valve sensor in the presence of two biasing currents, according to an embodiment of the present invention.
Figure 9B:
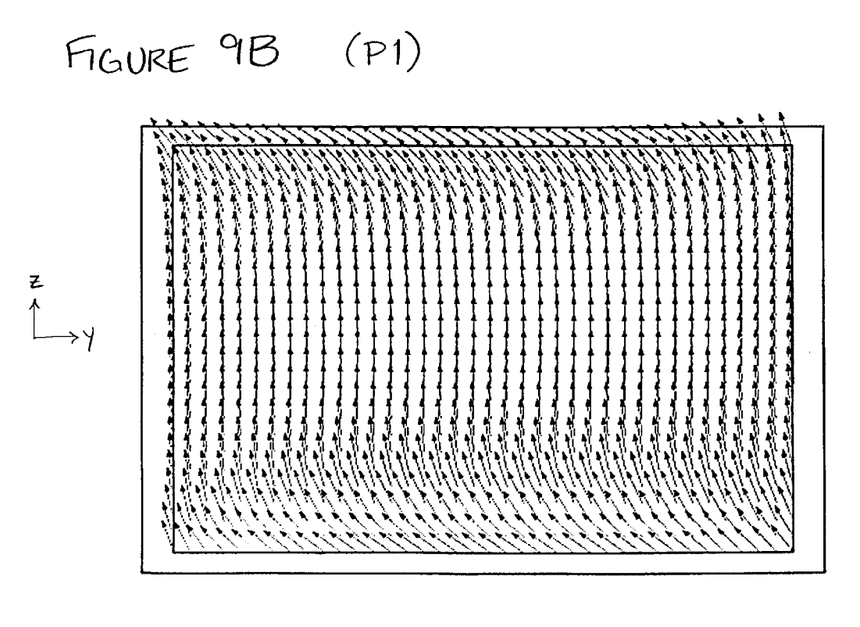
FIG. 9B depicts the magnetizations across a pinned layer of the dual-stripe spin valve sensor in the presence of two biasing currents, according to an embodiment of the present invention.
Figure 10A:
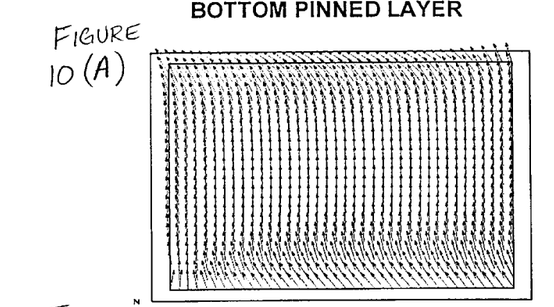
FIGS. 10A–10C depict the magnetizations across a pinned layer as in FIG. 9B, when exposed to three different external fields, respectively, according to an embodiment of the present invention.
Figure 10B:
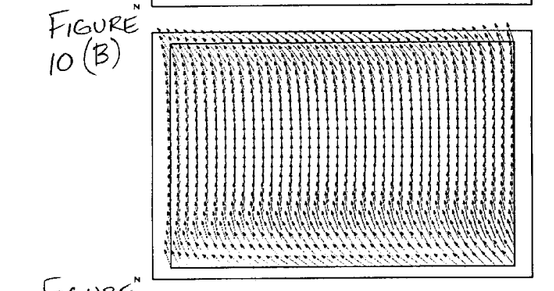
Figure 10C:
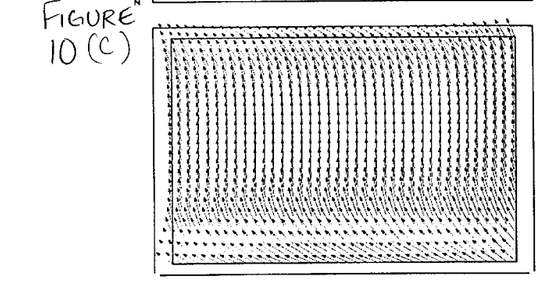
Figure 10D:
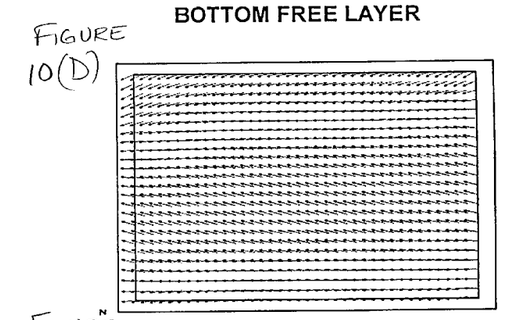
FIGS. 10D–10F depict the magnetizations across a free layer as in FIG. 9A, when exposed to three different external fields, respectively, according to an embodiment of the present invention.
Figure 10E:
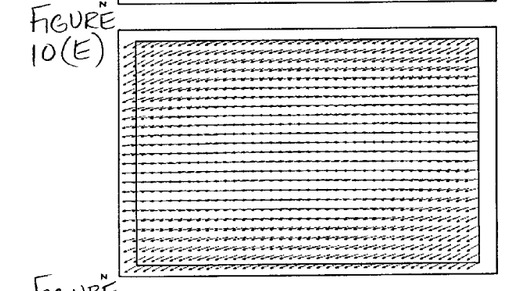
Figure 10F:
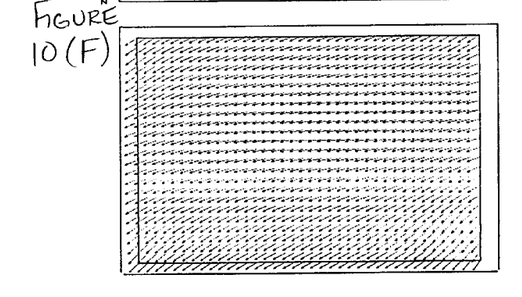

With reference to FIGS. 9A and 9B, the effect, due to the biasing currents, on the magnetizations of the first free layer F1 and first pinned layer P1, respectively, can be seen. FIG. 8A depicts the y-z components of the magnetization directions across the first free layer F1. During fabrication the first free layer F1 magnetization has been set to be substantially longitudinal (i.e., in the y-direction). As shown in FIG. 8A, the biasing magnetic fields due to the biasing currents have a negligible effect on the first free layer F1 magnetization throughout a substantially large portion of the first free layer F1. In stark contrast, the biasing magnetic fields cause the magnetization across the first pinned layer P1 to align with the biasing magnetic fields, which is substantially orthogonal to the magnetization across the first free layer F1 as shown in FIG. 8A. Because the first and second pinned layers P1 and P2 are pinned without use of an antiferromagnetic (AFM) layer, the read sensor of the present embodiment is significantly less sensitive to thermal asperities, thus improving the overall read performance capability.

The "free" nature of the free layers F1 and F2 can be further understood from FIG. 10. FIGS. 10A, 10B, and 10C show the magnetizations across the first pinned layer P1 when exposed to magnetic fields from media transitions with example Mrt's of +0.5, 0, and −0.5 memu/cm², respectively. Likewise, FIGS. 10D, 10E, and 10F illustrate the magnetizations across the first free layer F1 with exposure to the same magnetic fields, respectively. In particular, these results were calculated using micromagnetic theoretical simulation. As these figures illustrate, the magnetization of the first pinned layer is substantially unaffected by an impinging external magnetic field (FIGS. 10A and 10C). In contrast, however, the magnetization across the first free layer F1 is changed by a particular amount due to an Mrt=+0.5 memu/cm² (FIG. 10D). This magnetization is also changed by a substantially similar amount, although in the opposite direction, due to an Mrt=−0.5 memu/cm² (FIG. 10F). Thus, although it is in the presence of both biasing magnetic fields HIb1 and HIb2, the first free layer F1 reacts to changing external magnetic fields, in a way that changes the resistive response, thereby facilitating data retrieval. These magnetization responses of each layer to exposure to an external field, can also be seen in the graph of FIG. 11.

Figure 11:
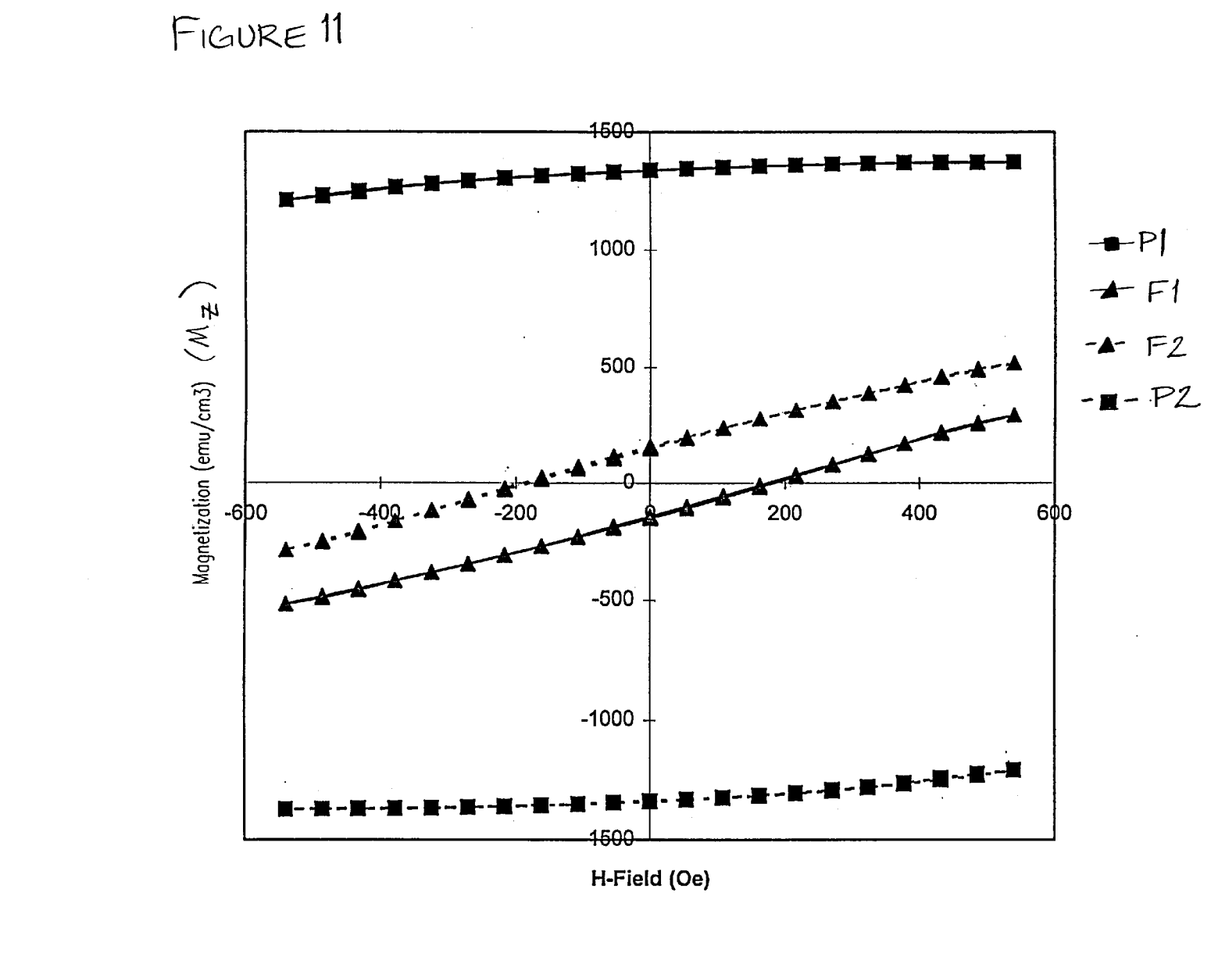
FIG. 11 is a graph of the transverse magnetization component in the soft ferromagnetic layers of the dual-stripe spin valve sensor for various external fields, according to an embodiment of the present invention.

FIG. 11 shows the transverse, or z-direction, component of the magnetization Mz of each soft FM layer of the dual-stripe current-pinned spin valve sensor 52, in response to an applied media field. The first and second free layers F1 and F2 have significant changes in transverse magnetization Mz, while the first and second pinned layers P1 and P2 have little to no response to changing external field. The first and second free layer F1 and F2 data points also indicate an asymmetric response. This asymmetry can be quantified by a measure sometimes referred to as the "track average amplitude asymmetry" (TAAA), which is expressed as a percentage. The larger the TAAA of a read sensor, the lower the read performance. The asymmetry of each spin valve stripe of the present invention can be further understood with reference to FIG. 12.

Figure 12:
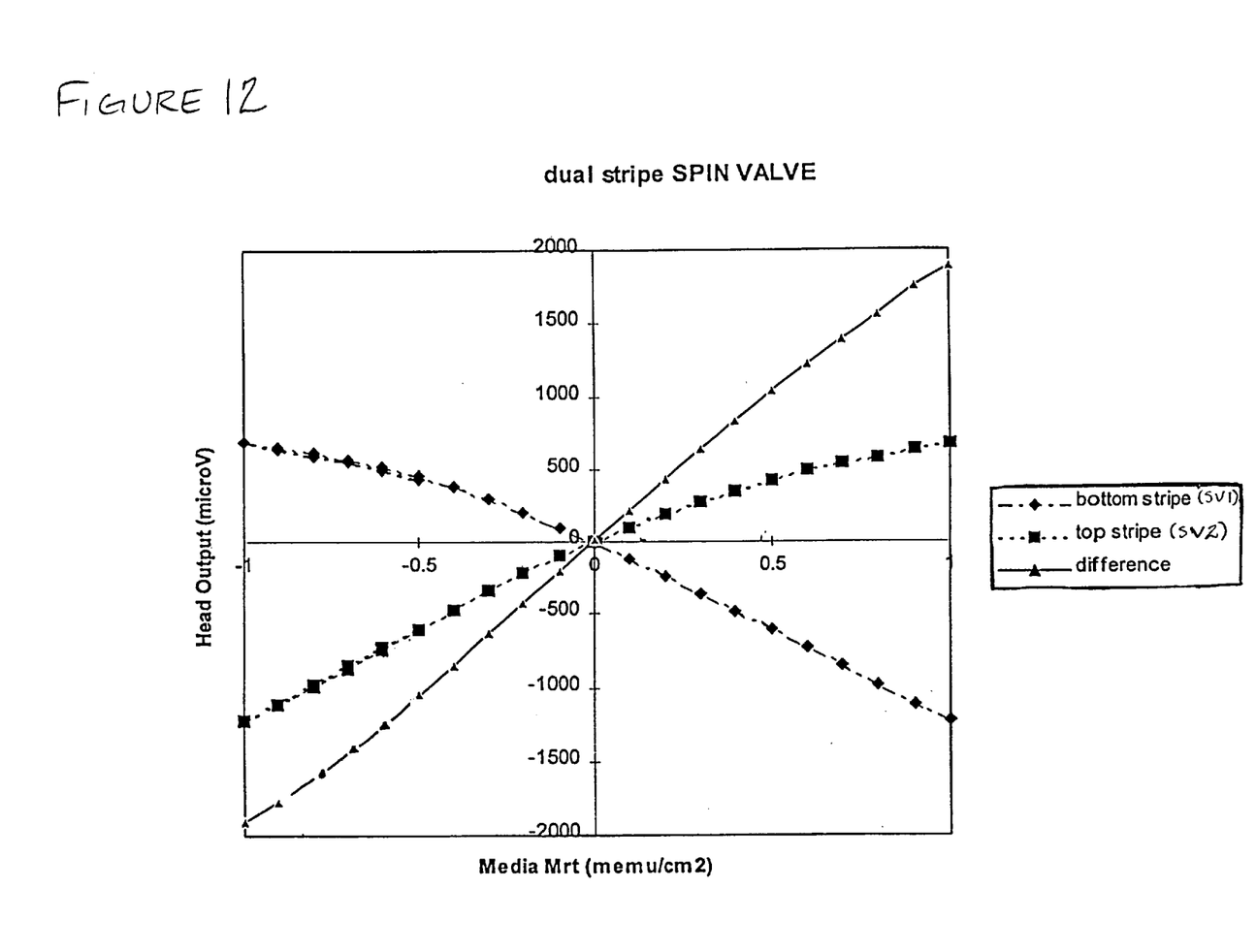
FIG. 12 is a graph of head output of each spin valve stripe of the dual-stripe spin valve sensor of FIGS. 6 and 7, and the difference between the two, for various external Mrt's, according to an embodiment of the present invention.

The read head output of the first and second spin valve stripes SV1 and SV2 of FIGS. 7 and 8 is shown for various media Mrt values in FIG. 12. The asymmetry of each individual spin valve stripe is shown by the nature of the dashed curves. The responses are asymmetric, and therefore read performance is less than optimal. However, the dual-stripe current-pinned spin valve read sensor 52 of FIGS. 6–8 has an output which is a measure of the difference in signals from the first and second spin valve stripes SV1, SV2. This is because the output has been combined with a differential amplifier as shown in FIG. 7. As can be seen by reference to the solid curve of FIG. 12, representing the difference between the first and second spin valve stripe head outputs, the entire read sensor responds substantially symmetrically (e.g., $TAAA_{Mrt=0.5} \cong -0.095\%$). Such operation of the read sensor is sometimes termed differential mode or common reject mode, and exhibits greater read performance than occurs with either spin valve stripe SV1 or SV2 alone. Differential mode operation can mitigate the effects of thermal asperities which can change the overall resistance of the device. The baseline resistance of the device can be cancelled by taking the difference of the signal from each spin valve.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

In summary, the present invention provides structures and methods for providing a magnetoresistive spin valve device that has a larger read signal, has reduced temperature and ESD sensitivity, has increased reliability, and operates in differential mode, and therefore exhibits increased read performance over previous read sensors. The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. For example, the above described read sensor can be incorporated with a write element to provide a read/write head, or further incorporated with other components of a disk drive system. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A dual-stripe current-pinned spin valve magnetoresistive read sensor, comprising:

a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction; and a second lead set electrically insulated from the first lead set and electrically connected to the second spacer layer by a second hard bias structure and configured to pass a second biasing current in the direction wherein the first free thickness and the second free thickness are in the range of about 40 angstroms to about 100 angstroms.

2. A dual-stripe current-pinned spin valve magnetoresistive read sensor, comprising:

a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction; and a second lead set electrically insulated from the first lead set and electrically connected to the second spacer layer by a second hard bias structure and configured to pass a second biasing current in the direction wherein the first pinned thickness and the second pinned thickness are in the range of about 20 angstroms to about 55 angstroms.

3. A dual-stripe current-pinned spin valve magnetoresistive read sensor, comprising:

a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction;

a second lead set electrically insulated from the first lead set and electrically connected to the second spacer layer by a second hard bias structure and configured to pass a second biasing current in the direction; and wherein the first biasing current has an amplitude sufficient to generate a first magnetic field with a strength sufficient to saturate the first pinned layer such that a first product of a magnetization of the first pinned layer multiplied by the first pinned thickness is less than a second product of a magnetization of the first free layer multiplied by the first free thickness.

4. The read sensor of claim 3 wherein the second biasing current has an amplitude sufficient to generate a second magnetic field with a strength sufficient to saturate the second pinned layer such that a third product of a magnetization of the second pinned layer multiplied by the second pinned thickness is less than a fourth product of a magnetization of the second free layer multiplied by the second free thickness.

5. The read sensor of claim 3 wherein a ratio of the second product to the first product is in the range of about 1.1 to about 10.

6. The read sensor of claim 5 wherein a ratio of the fourth product to the third product is in the range of about 1.1 to about 10.

7. The read sensor of claim 3 wherein the first and second biasing currents are 4 mA.

8. The read sensor of claim 3 further including a first voltage sensor configured to detect a voltage change across a first spin valve formed by the first pinned layer, the first spacer layer, and the first free layer, and a second voltage sensor configured to detect a voltage change across a second spin valve formed by the second pinned layer, the second spacer layer, and the second free layer.

9. The read sensor of claim 8 further including a signal manipulator configured to combine outputs from the first and second voltage sensors.

10. A read/write head comprising:

an inductive write element; and a read element including a dual-stripe current-pinned spin valve magnetoresistive read sensor having a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction; and a second lead set electrically insulated from the first lead set and electrically connected to the second spacer layer by a second hard bias structure and configured to pass a second biasing current in the direction wherein the first free thickness and the second free thickness are in the range of about 40 angstroms to about 100 angstroms.

11. A read/write head comprising:

an inductive write element; and a read element including a dual-stripe current-pinned spin valve magnetoresistive read sensor having a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction; and a second lead set electrically insulated from the first lead set and electrically connected to the second spacer layer by a second hard bias structure and configured to pass a second biasing current in the direction wherein the first pinned thickness and the second pinned thickness are in the range of about 20 angstroms to about 55 angstroms.

12. A read/write head comprising:

an inductive write element; and a read element including a dual-stripe current-pinned spin valve magnetoresistive read sensor having a first free layer having a first free thickness;

a second free layer having a second free thickness;

a single insulation layer formed of electrically insulating material and disposed between the first and second free layers;

a first spacer layer formed of a conductive material, the first free layer being disposed between the insulation layer and the first spacer layer;

a first pinned layer having a first pinned thickness, the first spacer layer being disposed between the first free layer and the first pinned layer;

a second spacer layer formed of a conductive material, the second free layer being disposed between the insulation layer and the second spacer layer;

a second pinned layer having a second pinned thickness, the second spacer layer being disposed between the second free layer and the second pinned layer;

a first lead set electrically connected to the first spacer layer by a first hard bias structure and configured to pass a first biasing current through the first spacer layer in a direction;

a second lead set electrically insulated from the first lead set and electrically connected to the second spacer layer by a second hard bias structure and configured to pass a second biasing current in the direction; and wherein the first biasing current has an amplitude sufficient to generate a first magnetic field with a strength sufficient to saturate the first pinned layer such that a first product of a magnetization of the first pinned layer multiplied by the first pinned thickness is less than a second product of a magnetization of the first free layer multiplied by the first free thickness.

13. The read/write head of claim 12 wherein the second biasing current has an amplitude sufficient to generate a second magnetic field with a strength sufficient to saturate the second pinned layer such that a third product of a magnetization of the second pinned layer multiplied by the second pinned thickness is less than a fourth product of a magnetization of the second free layer multiplied by the second free thickness.

14. The read/write head of claim 12, wherein a ratio of the second product to the first product is in the range of about 1.1 to about 10.

15. The read/write head of claim 14 wherein a ratio of the fourth product to the third product is in the range of about 1.1 to about 10.

16. The read/write head of claim 12 wherein the first and second biasing currents are 4 mA.

17. The read/write head of claim 12 further including a first voltage sensor configured to detect a voltage change across a first spin valve formed by the first pinned layer, the first spacer layer, and the first free layer, and a second voltage sensor configured to detect a voltage change across a second spin valve formed by the second pinned layer, the second spacer layer, and the second free layer.

18. The read/write head of claim 17 further including a signal manipulator configured to combine outputs from the first and second voltage sensors.

19. The read/write head of claim 18 wherein the signal manipulator is a differential amplifier and is configured to output the difference between the outputs from the first and second voltage sensors.

20. A method of making a dual-stripe current-pinned spin valve magnetoresistive read sensor, comprising:

forming a first spin valve stripe;

forming a first lead set including a first hard bias structure electrically connected to the first spin valve stripe;

forming a single insulation layer of electrically insulating material above the first spin valve stripe;

forming a second spin valve stripe above the single insulation layer; and forming a second lead set including a second hard bias structure electrically connected to the second spin valve stripe, the second lead set being electrically isolated from the first lead set;

wherein forming a first spin valve stripe includes forming a first soft ferromagnetic layer, forming a second soft ferromagnetic layer, and forming a first spacer layer between the first and second soft ferromagnetic layers;

wherein forming a second spin valve stripe includes forming a third soft ferromagnetic layer, forming a fourth soft ferromagnetic layer, and forming a second spacer layer between the third and fourth soft ferromagnetic layers; and wherein the first and fourth soft ferromagnetic layers each have a thickness in the range of about 20 angstroms to about 55 angstroms.

21. A method of making a dual-stripe current-pinned spin valve magnetoresistive read sensor, comprising:

forming a first spin valve stripe;

forming a first lead set including a first hard bias structure electrically connected to the first spin valve stripe;

forming a single insulation layer of electrically insulating material above the first spin valve stripe;

forming a second spin valve stripe above the single insulation layer; and forming a second lead set including a second hard bias structure electrically connected to the second spin valve stripe, the second lead set being electrically isolated from the first lead set;

wherein forming a first spin valve stripe includes forming a first soft ferromagnetic layer, forming a second soft ferromagnetic layer, and forming a first spacer layer between the first and second soft ferromagnetic layers;

wherein forming a second spin valve stripe includes forming a third soft ferromagnetic layer, forming a fourth soft ferromagnetic layer, and forming a second spacer layer between the third and fourth soft ferromagnetic layers; and wherein the second and third soft ferromagnetic layers each have a thickness in the range of about 40 angstroms to about 100 angstroms.

22. The method of claim 20 or claim 21 wherein the first and fourth soft ferromagnetic layers are formed of CoFe and the second and third soft ferromagnetic layers are formed of NiFe.

* * * * *